(12) United States Patent
Raghavan

(10) Patent No.: US 12,457,781 B2
(45) Date of Patent: Oct. 28, 2025

(54) NANOSHEET SIZING FOR POWER DELIVERY

(71) Applicant: Apple Inc., Cupertino, CA (US)

(72) Inventor: Praveen Raghavan, Cupertino, CA (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 18/524,600

(22) Filed: Nov. 30, 2023

(65) Prior Publication Data
US 2025/0107177 A1 Mar. 27, 2025

Related U.S. Application Data

(60) Provisional application No. 63/585,404, filed on Sep. 26, 2023.

(51) Int. Cl.
| | |
|---|---|
| *H10D 62/10* | (2025.01) |
| *H10D 30/01* | (2025.01) |
| *H10D 30/43* | (2025.01) |
| *H10D 30/67* | (2025.01) |
| *H10D 62/17* | (2025.01) |
| *H10D 64/01* | (2025.01) |

(Continued)

(52) U.S. Cl.
CPC ......... *H10D 62/121* (2025.01); *H10D 30/014* (2025.01); *H10D 30/43* (2025.01); *H10D 30/6735* (2025.01); *H10D 30/6757* (2025.01); *H10D 62/292* (2025.01); *H10D 64/017* (2025.01); *H10D 84/83* (2025.01)

(58) Field of Classification Search
CPC .... H10D 62/121; H10D 30/014; H10D 30/43; H10D 30/6735; H10D 30/6757; H10D 62/292; H10D 64/017; H10D 84/83

USPC ......................................................... 257/288
See application file for complete search history.

(56) References Cited

U.S. PATENT DOCUMENTS 11,031,395 B2  6/2021  Ohtou et al.
11,088,256 B2  8/2021  Chung et al.
(Continued)

FOREIGN PATENT DOCUMENTS

KR  10-2021-0000529 A  1/2021
KR  10-2021-0078390 A  6/2021
(Continued)

OTHER PUBLICATIONS

International Search Report and Written Opinion in PCT Appl. No. PCT/US2024/044532 mailed Dec. 9, 2024, 9 pages.

*Primary Examiner* — Tong-Ho Kim
(74) *Attorney, Agent, or Firm* — Kowert, Hood, Munyon, Rankin & Goetzel, P.C.; Gareth M. Sampson; Dean M. Munyon

(57) ABSTRACT

Various structures that implement nanosheet transistors are disclosed. The various structures include nanosheet transistors with different widths inside a transistor device. Variation of the width of nanosheet transistors within a transistor device allows for different designs of the input stage and the output stage of the transistor device that may improve power utilization and performance of the transistor device. In some instances, the input stage has nanosheet transistors with smaller width nanosheet fins than nanosheet transistors in the output stage. Variations in nanosheet transistor width may also be implemented within the input stage or the output stage by merging of nanosheet fins.

20 Claims, 6 Drawing Sheets

(51) Int. Cl.
    *H10D 84/03*     (2025.01)
    *H10D 84/83*     (2025.01)
    *H10D 84/85*     (2025.01)

(56) References Cited

U.S. PATENT DOCUMENTS

| | | |
|---|---|---|
| 11,323,070 B1 | 5/2022 | Pretl et al. |
| 11,380,685 B2 | 7/2022 | Bao et al. |
| 11,393,815 B2 | 7/2022 | Lin et al. |
| 11,594,610 B2 | 2/2023 | Chiu et al. |
| 2020/0343387 A1* | 10/2020 | Liaw .................. H10D 30/6757 |
| 2022/0108983 A1 | 4/2022 | Bao et al. |
| 2023/0178653 A1 | 6/2023 | Mochizuki et al. |
| 2023/0299001 A1 | 9/2023 | Narayan et al. |

FOREIGN PATENT DOCUMENTS

| | | |
|---|---|---|
| KR | 10-2022-0144304 A | 10/2022 |
| TW | 202240901 A | 10/2022 |
| TW | 202310402 A | 3/2023 |
| TW | 202312354 A | 3/2023 |

\* cited by examiner

NANOSHEET SIZING FOR POWER DELIVERY

PRIORITY CLAIM

The present application claims priority to U.S. Provisional App. No. 63/585,404, entitled "Nanosheet Sizing for Power Delivery," filed Sep. 26, 2023, the disclosure of which is incorporated by reference herein in its entirety.

BACKGROUND

Technical Field

Embodiments described herein relate to transistor structures for semiconductor devices. More particularly, embodiments described herein relate to structures for nanosheet transistors in integrated circuit devices.

Description of the Related Art

Nanosheet (e.g., gate-all-around) transistors are increasingly being utilized in integrated circuits. Nanosheet transistors may have more effective characteristics for turning on/off the transistors versus planar FETs or FinFETs due to the increase in gate control of the channel provided by the geometry of the nanosheet transistor design. The increased effectiveness in turning the transistors on or off may provide leakage reduction and better power utilization (e.g., voltage reduction) for integrated circuits utilizing nanosheet transistors. Nanosheet transistors may have a more complex design than planar FETs or FinFETs. As the design of integrated circuits evolves, more avenues for utilization of the more complex design of nanosheet transistors may be contemplated.

BRIEF DESCRIPTION OF THE DRAWINGS

Features and advantages of the methods and apparatus of the embodiments described in this disclosure will be more fully appreciated by reference to the following detailed description of presently preferred but nonetheless illustrative embodiments in accordance with the embodiments described in this disclosure when taken in conjunction with the accompanying drawings in which.

Figure 1:
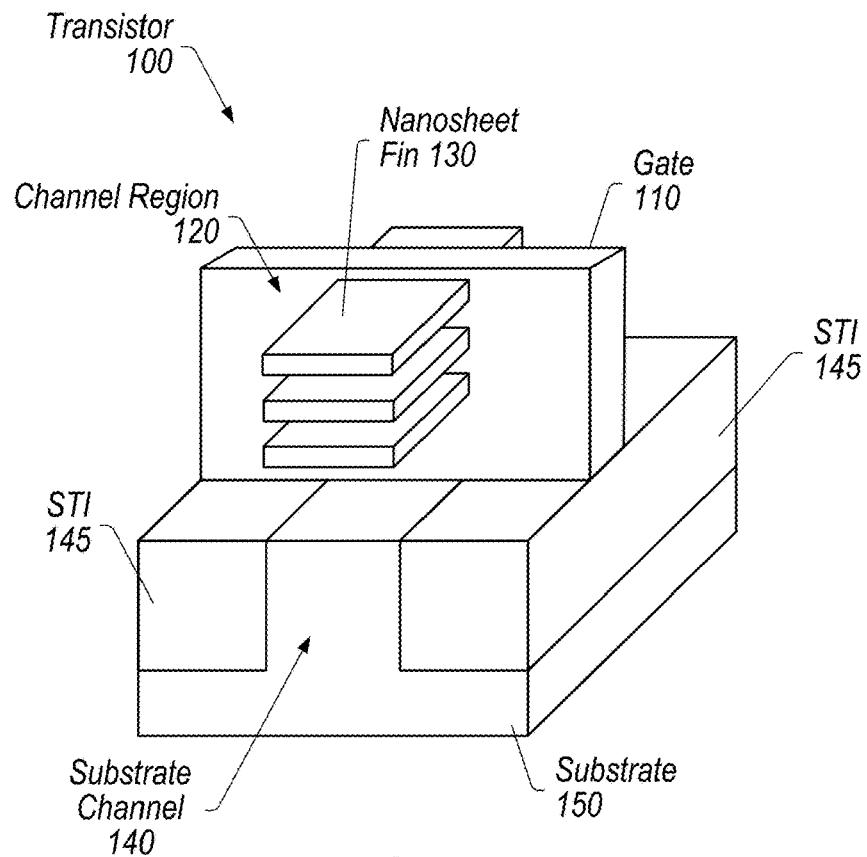
FIG. 1 depicts a perspective representation of a nanosheet transistor, according to some embodiments.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

DETAILED DESCRIPTION OF EMBODIMENTS

As used herein, the term "standard cell" refers to a group of transistor structures, passive structures, and interconnect structures formed on a substrate to provide logic or storage functions that are standard for a variety of implementations. For example, an individual standard cell may be one cell in a library of multiple cells from which various suitable cells may be selected to implement a specific cell design. As further example, a standard cell may be a cell design that is created (e.g., designed) and then the cell design is implemented multiple times for generating integrated circuit devices via, for instance, synthesis or automated flows. Integrated circuit cells may also include custom circuit design cells that are individually designed for a particular implementation. Embodiments of circuit design cells described herein may be implemented in various implementations of logic integrated circuits or memory integrated circuits.

FIG. 1 depicts a perspective representation of a nanosheet transistor, according to some embodiments. In the illustrated embodiment, nanosheet transistor 100 is formed on substrate 150. In certain embodiments, transistor 100 includes gate 110 and channel region 120. Gate 110 may be a polysilicon gate or a metal gate. Channel region 120 includes nanosheet fins 130 and substrate channel 140. Nanosheet fins 130 are fins made of silicon, another semiconductor, or a combination of semiconductors that pass through the structure (e.g., the material) of gate 110. In various embodiments, nanosheet fins 130 are relatively thin (in the vertical dimension), rectangular sheets of semiconductor material that are aligned parallel to substrate 150 (e.g., the horizontal planes of nanosheet fins 130 are parallel to the horizontal plane of substrate 150). Transistor 100 typically includes multiple nanosheet fins 130 passing through gate 110. For instance, as shown in FIG. 1, transistor 100 includes three nanosheet fins 130 passing through gate 110.

In various embodiments, substrate channel 140 is formed in substrate 150 below nanosheet fins 130. Substrate channel 140 may be formed by forming shallow trench isolations (STIs) 145 on either side of the substrate channel in substrate 150. Thus, substrate channel 140 is a portion of substrate 150 between STIs 145. In certain embodiments, substrate channel 140 is aligned with and has similar horizontal dimensions (e.g., length or width) as nanosheet fins 130. In some embodiments, substrate channel 140 is made of the same semiconductor material as nanosheet fins 130. For instance, both nanosheet fins 130 and substrate channel 140 may be silicon.

Figure 2:
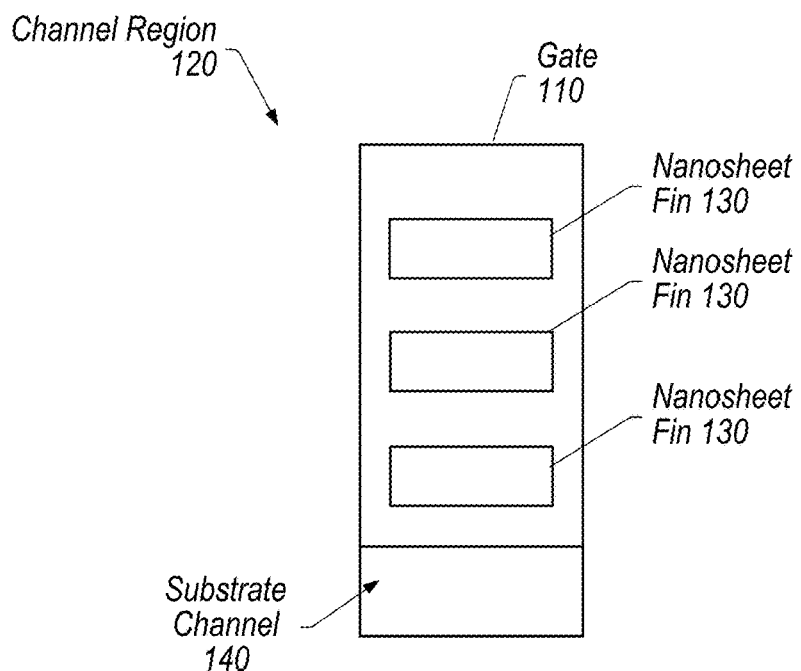
FIG. 2 depicts an end-view representation of a channel region, according to some embodiments.

FIG. 2 depicts an end-view representation of channel region 120, according to some embodiments. In the illustrated embodiment, channel region 120 includes nanosheet fins 130 inside gate 110 above substrate channel 140. In certain embodiments, gate 110 substantially surrounds (e.g., is "all-around") nanosheet fins 130. It should be noted there may be at least some gate dielectric material (not shown) between nanosheet fins 130 and gate 110. Surrounding nanosheet fins 130 with gate 110 provides better control over operation of the gate and reduces current leakage from the gate to produce more effective characteristics for turning the gate on and off.

Figure 3:
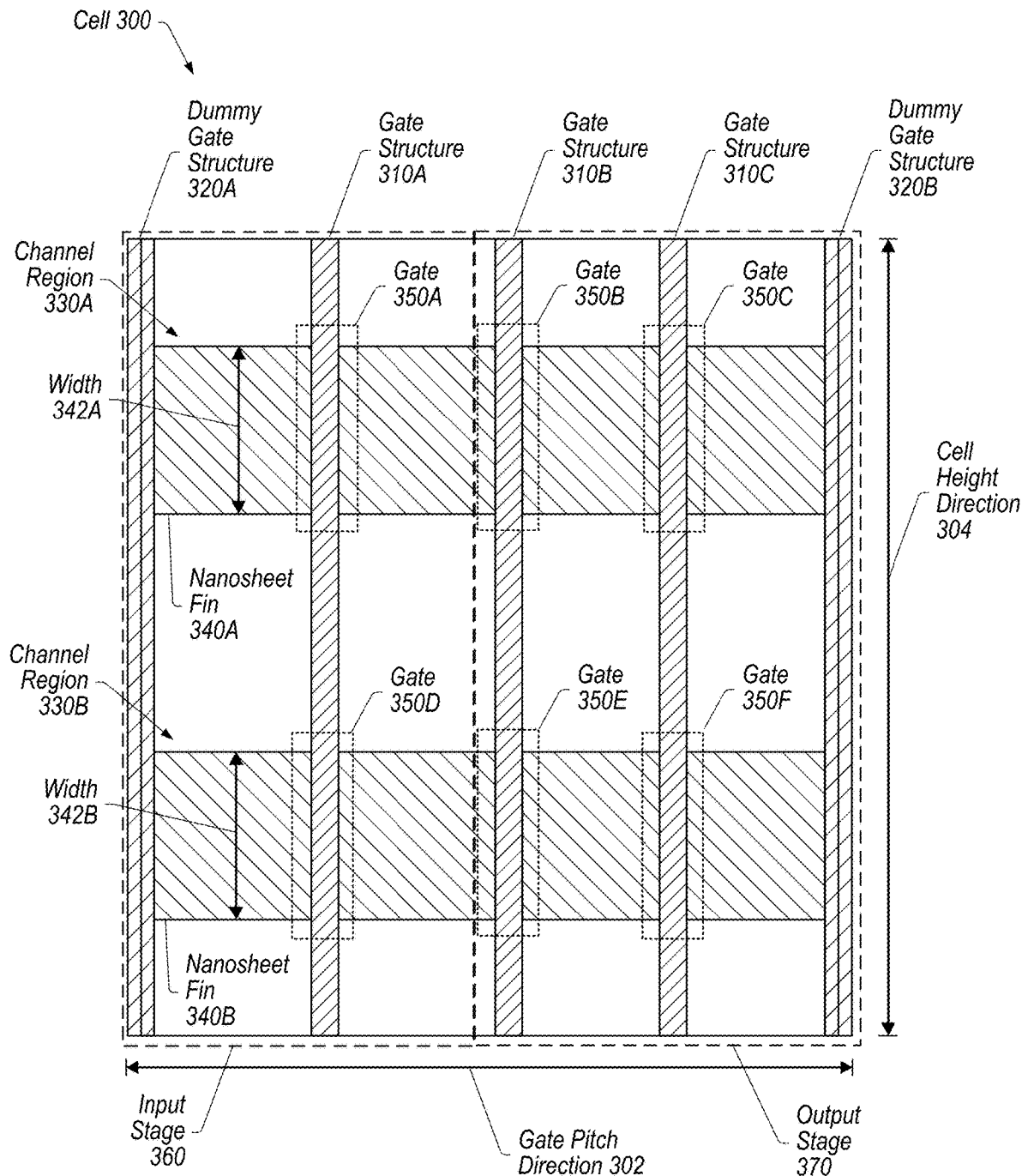
FIG. 3 depicts a top plan view representation of a standard cell layout with nanosheet transistors, according to some embodiments.

FIG. 3 depicts a top plan view representation of a standard cell layout with nanosheet transistors, according to some embodiments. In the illustrated embodiment, standard cell 300 includes active gate structures 310A-C and dummy (e.g., inactive) gate structures 320A-B. In various embodiments, active gate structures 310A-C and dummy gate structures 320A-B are formed of the same materials and are structurally similar. In such embodiments, the determination of whether the gate structures are "active" or "dummy" may be made by whether connections are made to the gates or not in the layout and design of cell 300.

In some embodiments, dummy gate structures 320A-B are implemented to delineate (e.g., isolate) structures in a cell or a layout of cells from other structures. For example, as shown in FIG. 3, dummy gate structure 320A is placed at a left edge of cell 300 in gate pitch direction 302 (e.g., horizontal direction of cell) and dummy gate structure 320B is placed at a right edge of cell 300. Accordingly, dummy gate structures 320A-B isolate active gate structures 310A-C from cells or other structures to the left and right of cell 300 in gate pitch direction 302.

In various embodiments, active gate structures 310A-C and dummy gate structures 320A-B are fingers or lines of gate material that span (e.g., extend) across cell 300 in the cell height direction 304 (e.g., vertical direction of cell). Examples of gate material include, but are not limited to, polysilicon or metal. In some embodiments, the gate material of gate structures 310A-C may extend beyond the boundaries of cell 300. For example, gate structures 310A-C may include gate material that extends into neighboring cells above or below cell 300 in cell height direction 304.

In various embodiments, cell 300 includes channel regions 330A-B. In certain embodiments, channel regions 330A-B include nanosheet fins 340A-B. Nanosheet fins 340A-B may include multiple stacked nanosheet fins, such as nanosheet fins 130, shown in FIGS. 1 and 2. Thus, only the top nanosheet fins are shown as nanosheet fin 340A and nanosheet 340B, in the top plan view of FIG. 3. In various embodiments, as shown in FIG. 3, nanosheet fins 340A-B extend across the width of cell 300 in gate pitch direction 302. For instance, nanosheet fins 340A-B extend between dummy gate structure 320A and dummy gate structure 320B.

In certain embodiments, active gates 350 (dotted line boxes) are formed at the regions where nanosheet fins 340A-B (oriented in gate pitch direction 302) intersect with active gate structures 310A-C (oriented in cell height direction 304). For instance, in the illustrated embodiment of FIG. 3, active gates 350A-C are formed at the regions where nanosheet fin 340A intersects active gate structures 310A-C and active gates 350D-F are formed at the regions where nanosheet fin 340B intersects active gate structures 310A-C. Accordingly, cell 300 includes six active gates (gates 350A-F) within the boundaries of the standard cell. Active gates 350A-F may have similar structures to gate 110, shown in FIGS. 1 and 2.

In current implementations of standard cells, such as cell 300, nanosheet fins 340A-B have the same horizontal width (e.g., a fixed width determined by the design and dimensions of the cell). For instance, width 342A of nanosheet fin 340A is approximately the same as width 342B of nanosheet fin 340B. Note that width 342A and width 342B are shown vertically in the illustration of FIG. 3 but are the horizontal widths of the nanosheet fins (e.g., horizontal widths of nanosheet fins 130, shown in FIGS. 1 and 2). In various embodiments, a transistor device based on cell 300 may have an input stage and an output stage. For example, as shown in FIG. 3, cell 300 may include input stage 360 and output stage 370 (dashed line boxes).

In cell 300, as gates 350A-F all have substantially the same operating properties (e.g., drive current capacity, capacitance, and power) since nanosheet fins 340A-B have the same widths, the different operating properties desired for input stage 360 and output stage 370 may be implemented by selecting the number of gates used in the input stage versus the output stage. For instance, in the illustrated embodiment of cell 300, input stage 360 includes two active gates (active gate 350A and active gate 350D) while output stage 370 includes four active gates (active gate 350B, active gate 350C, active gate 350E, and active gate 350F). Output stage 370 has more active gates to enable a larger drive output while input stage 360 has less active gates to have lower capacitance in the input. Because the widths of the nanosheet fins 340 in cell 300 are substantially the same, there may be limited flexibility in designing input and output stages for the transistor device of cell 300. For example, variation in the design of the stages is generally implementable only by variation in the selection of the number of active gates in each stage.

The present disclosure recognizes that additional flexibility in the design of transistor devices may be enabled by providing variations in the widths of nanosheet fins across transistors within a transistor device to provide more flexibility in the design of the input and output stages of the transistor device. The increased flexibility may provide improved power utilization and improved performance over transistor devices with nanosheet transistors having the same width across the transistors. For instance, flexibility in the design of the input/output stages may allow transistor devices to have larger current drive capacity to other devices from the output stage while having lower capacitance (as seen by the other devices) in the input stage.

Certain embodiments disclosed herein have four broad elements: 1) a plurality of gate structures oriented along a first direction; 2) a plurality of elongated channel regions oriented along a second direction where the elongated channel regions include two or more stacked nanosheet fins, 3) an input stage including elongated channel regions with nanosheet fins having a first width along the first direction, and 4) an output stage including elongated channel regions with nanosheet fins having a second width along the first direction larger than the first width. In certain embodiments, the elongated channel regions pass through the gate structures with active gates being located at intersections of the nanosheet fins and the gate structures. In some embodiments, the input stage and the output stage are in separate cells separated in the cell height direction with the gate structures extending across both the stages.

Various illustrations of embodiments with these broad elements are now described in the present disclosure. It should be noted that the illustrated embodiments of the present disclosure depict design templates for cells with various nanosheet transistors that may be implemented in input and output stages of transistor devices. These design templates provide basic building blocks from which many different types of devices may be constructed based on connection schemes to the transistors in the design templates. For example, simple devices (such as inverters, NAND devices, multiplexers (MUXs)) as well as more complex devices (e.g., complex FETs) may be constructed based on the basic building blocks of the present disclosure.

Figure 4:
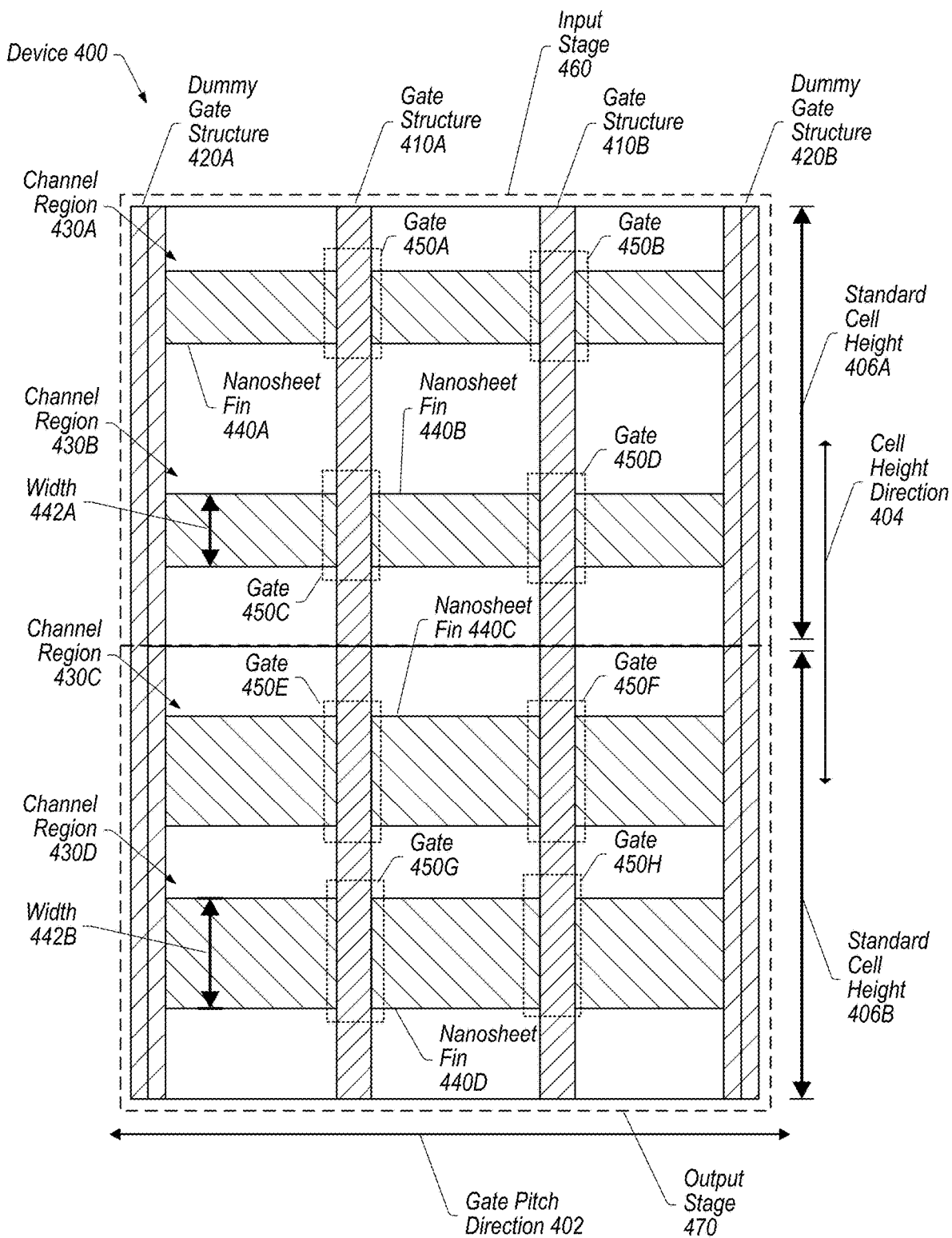
FIG. 4 depicts a top plan view representation of a layout of a transistor device with nanosheet transistors, according to some embodiments.

FIG. 4 depicts a top plan view representation of a layout of a transistor device with nanosheet transistors, according to some embodiments. In the illustrated embodiment, transistor device 400 is device with a cell width in gate pitch direction 402 that is the standard cell width and a cell height in cell height direction 404 that is two times the standard cell height (e.g., 2× standard cell heights 406A-B). In some embodiments, a standard cell height is a cell height that accommodates two rows of channel regions and nanosheet transistor fins (e.g., two channel regions 430 with nanosheet fins 440).

In certain embodiments, device 400 includes active gate structures 410A-B and dummy (e.g., inactive) gate structures 420A-B. Dummy gate structures 420A-B define the edges of device 400 in gate pitch direction 402 and isolate device 400 from other devices in the gate pitch direction with dummy gate structure 420A defining the left edge and dummy gate structure 420B defining the right edge. In various embodiments, active gate structures 410A-B and dummy gate structures 420A-B are fingers or lines of gate material that span (e.g., extend) across device 400 in the cell height direction 404 (e.g., the vertical direction of the device in the illustration). The gate material may be, for example, polysilicon or metal. In some embodiments, the gate material of gate structures 410A-B or dummy gate structures 420A-B may extend beyond the boundaries of device 400.

In certain embodiments, device 400 is separated into input stage 460 in a top portion of the device (as defined by standard cell height 406A) and output stage 470 in a bottom portion of the device (as defined by standard cell height 406B). Various routing in layers above the structures shown in FIG. 4 may be implemented to define the connections between input stage 460 and output stage 470.

In certain embodiments, input stage 460 includes channel regions 430A-B while output stage 470 includes channel regions 430C-D. In various embodiments, channel regions 430A-B include nanosheet fins 440A-B and channel regions 430C-D include nanosheet fins 440C-D. Each of nanosheet fins 440A-D may include stacked nanosheet fins, such as nanosheet fins 130, shown in FIGS. 1 and 2. Nanosheet fins 440A-D extend across the width of device 400 in gate pitch direction 402. For instance, nanosheet fins 440A-D may extend between dummy gate structure 420A and dummy gate structure 420B.

In various embodiments, input stage 460 includes active gates 450A-D. Active gates 450A-D (dotted line boxes) may be formed at the regions where nanosheet fins 440A-B (oriented in gate pitch direction 402) intersect active gate structures 410A-B (oriented in cell height direction 404). For example, active gates 450A-B are formed at the regions where nanosheet fin 440A intersects active gate structures 410A-B while active gates 450C-D are formed at the regions where nanosheet fin 440B intersects active gate structures 410A-B.

In various embodiments, output stage 470 includes active gates 450E-H. Active gates 450E-H (dotted line boxes) may be formed at the regions where nanosheet fins 440C-D (oriented in gate pitch direction 402) intersect active gate structures 410A-B (oriented in cell height direction 404). For example, active gates 450E-F are formed at the regions where nanosheet fin 440C intersects active gate structures 410A-B while active gates 450G-H are formed at the regions where nanosheet fin 440D intersects active gate structures 410A-B. Accordingly, both input stage 460 and output stage 470 may include the same number of active gates (e.g., four each in device 400).

In the illustrated embodiment of FIG. 4, nanosheet fins 440A-B in input stage 460 have width 442A and nanosheet fins 440C-D in output stage 470 have width 442B. In certain embodiments, width 442A is different from width 442B. For instance, width 442A may be less than width 442B and nanosheet fins 440A-B are heterogeneous relative to nanosheet fins 440C-D. Variation in the width of the nanosheet fins 440 between input stage 460 and output stage 470 may be implemented to provide varying properties in the active gates 450 associated with the nanosheet fins. For example, in device 400, input stage 460 includes active gates 450A-D that have nanosheet fins 440A-B with the smaller width (width 442A) than active gates 450E-H that have nanosheet fins 440C-D in output stage 470. The smaller width nanosheet fins may be implemented in input stage 460 to reduce the capacitance that may be experienced by other devices around device 400. Additionally, the larger width nanosheet fins implemented in output stage 470 increases the drive current capacity of device 400 such that as much drive output as possible is provided to the other devices outside of device 400. Reducing the capacitance of device 400 seen by other devices while providing as much drive output as possible increases the performance and power utilization of device 400 (along with other devices associated with device 400).

One example of a transistor device that may benefit from having reduced capacitance in the input stage and increased drive output to other devices is a clock implemented in a flop circuit. Having a clock with reduced capacitance in the input stage reduces the effect of its capacitance on other devices connected to the clock while providing a high signal output from the clock that can be readily received in the other devices. Such a clock device may also be implemented in the flop circuit at a smaller area size, reducing the area penalty of the clock in the flop circuit.

Additional embodiments of devices may be contemplated where the width of the device is increased to place the input stage and output stage side-by-side in the device (e.g., side-by-side in the gate pitch direction). Placing the input stage and output stage side-by-side in the gate pitch direction may allow further variation in design of channel regions and gates formed by the channel regions. For instance, widths of the channel regions may be varied between gates in the input stage or output stage, or larger width channel regions may be created by merging channel regions. Various example embodiments are now described with the understanding that the elements in each example may be applied to other embodiments including contemplations now depicted explicitly herein.

Figure 5:
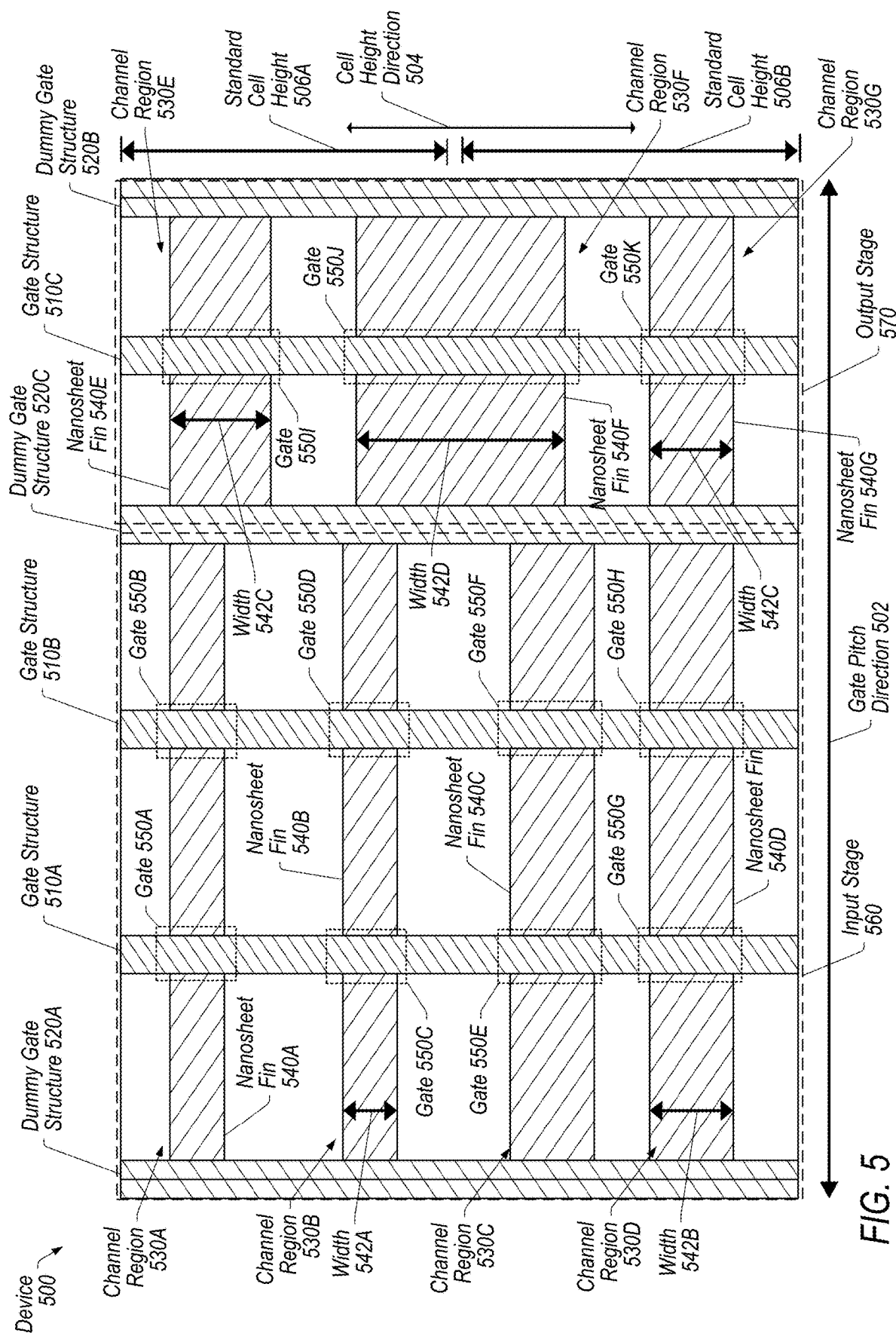
FIG. 5 depicts a top plan view representation of a layout of a transistor device with nanosheet transistors having merged nanosheet fins in the output stage, according to some embodiments.

FIG. 5 depicts a top plan view representation of a layout of a transistor device with nanosheet transistors having merged nanosheet fins in the output stage, according to some embodiments. In the illustrated embodiment, transistor device 500 is device with a cell width in gate pitch direction 502 that is wider than the cell width in FIGS. 3 and 4. Device 500 has a cell height in cell height direction 504 that is two times the standard cell height (e.g., 2× standard cell heights 506A-B) and similar in height to device 400, shown in FIG. 4.

In certain embodiments, device 500 includes active gate structures 510A-C and dummy (e.g., inactive) gate structures 520A-C. In various embodiments, active gate structures 510A-C and dummy gate structures 520A-C are fingers or lines of gate material that span (e.g., extend) across device 500 in the cell height direction 504 (e.g., the vertical direction of the device in the illustration). The gate material may be, for example, polysilicon or metal. In some embodiments, the gate material of gate structures 510A-C or dummy gate structures 520A-C may extend beyond the boundaries of device 500.

In various embodiments, dummy gate structures 520A-B define the edges of device 500 in gate pitch direction 502 and isolate device 500 from other devices in the gate pitch direction with dummy gate structure 520A defining the left edge and dummy gate structure 520B defining the right edge. In certain embodiments, dummy gate structure 520C separates device 500 into input stage 560 and output stage 570. For instance, device 500 is separated by dummy gate structure 520C into input stage 560 in a left portion of the device (in gate pitch direction 502) and output stage 570 in a right portion of the device. Various routing in layers above the structures shown in FIG. 5 may be implemented to define the connections between input stage 560 and output stage 570.

In certain embodiments, input stage 560 includes channel regions 530A-D while output stage 570 includes channel regions 530E-G. Channel regions 530A-G may include corresponding nanosheet fins 540A-G. Each of nanosheet fins 540A-G may include stacked nanosheet fins, such as nanosheet fins 130, shown in FIGS. 1 and 2. In various embodiments, nanosheet fins 540A-D extend across the width of the input stage 560 in gate pitch direction 502. For instance, nanosheet fins 540A-D may extend between dummy gate structure 520A and dummy gate structure 520C. Nanosheet fins 540E-G extend across the width of output stage 570 in gate pitch direction 502 between dummy gate structure 520C and dummy gate structure 520B.

In various embodiments, input stage 560 includes active gates 550A-H. Active gates 550A-D (dotted line boxes) may be formed at the regions where nanosheet fins 540A-B (oriented in gate pitch direction 502) intersect active gate structures 510A-B (oriented in cell height direction 504). Additionally, active gates 550E-H (dotted line boxes) may be formed at the regions where nanosheet fins 540C-D (oriented in gate pitch direction 502) intersect active gate structures 510A-B (oriented in cell height direction 504). For example, active gates 550A-B are formed at the regions where nanosheet fin 540A intersects active gate structures 510A-B, active gates 550C-D are formed at the regions where nanosheet fin 540B intersects active gate structures 510A-B, active gates 550E-F are formed at the regions where nanosheet fin 540C intersects active gate structures 510A-B, and active gates 550G-H are formed at the regions where nanosheet fin 540D intersects active gate structures 510A-B.

In the illustrated embodiment of FIG. 5, nanosheet fins 540A-B in input stage 560 have width 542A and nanosheet fins 540C-D in the input stage have width 542B. In certain embodiments, width 542A is different from width 542B. For instance, width 542A may be less than width 542B and nanosheet fins 540A-B are heterogeneous relative to nanosheet fins 540C-D. Variation in the width of the nanosheet fins 540 in input stage 560 allows connections to different sized gates to be available within the input stage. Accordingly, input stage 560 increases flexibility in the design of device 500 by providing gate properties and corresponding gate connectivity that may be implemented in various different types of transistor devices.

In certain embodiments, output stage 570 includes active gates 550I-K formed at the regions where nanosheet fins 540E-G (oriented in gate pitch direction 502) intersect active gate structure 510C (oriented in cell height direction 504) between dummy gate structure 520C and dummy gate structure 520B. For example, active gate 550I (dotted line box) is formed at the region where nanosheet fin 540E intersects active gate structure 510C, active gate 550J (dotted line box) is formed at the region where nanosheet fin 540F intersects active gate structure 510C, and active gate 550K (dotted line box) is formed at the region where nanosheet fin 540G intersects active gate structure 510C.

In various embodiments, output stage 570 is based on a layout that includes four nanosheets of similar size (e.g., similar widths) with two of the nanosheets merged to form a single nanosheet. For example, in the illustrated embodiment of FIG. 5, nanosheet fin 540E (in channel region 530E) and nanosheet fin 540G (in channel region 530G) are individual nanosheet fins where nanosheet fin 540F (in channel region 530F) is formed by the merging two individual nanosheet fins. Merging of the nanosheet fins to form nanosheet fin 540F may be implemented by designing the formation of the two individual nanosheet fins to be substantially adjacent or with some overlap in the layout.

Accordingly, in the illustrated embodiment of FIG. 5, nanosheet fin 540E and nanosheet fin 540G both have width 542C while nanosheet fin 540F has width 542D, which is approximately double width 542C. As such, nanosheet fin 540F in output stage 570 is larger than either nanosheet fin 540E or nanosheet fin 540G and active gate 550J (corresponding to nanosheet fin 540F) has a higher drive current capacity than either active gate 550I (corresponding to nanosheet fin 540E) or active gate 550K (corresponding to nanosheet fin 540G). In certain embodiments, width 542D is approximately twice width 542C and thus active gate 550J has about twice the drive current capacity of active gate 550I or active gate 550K. While nanosheet fin 540E and nanosheet fin 540G are shown in FIG. 5 with the same width, some embodiments may be contemplated where nanosheet fin 540E and nanosheet fin 540G have different widths.

With the variation in widths (and drive current capacity) in active gates 550I-K in output stage 570, there is increased flexibility in the design of device 500 as different outputs can be implemented based on providing different connections to the active gates. For example, in one contemplated embodiment, active gate 550J (which has the largest drive current capacity) may be connected to another device needing to receive higher drive output from device 500 while active gates 550I and 550K may be connected to other devices that have lower needs for drive output from device 500.

Device 500 also has the design benefits of input stage 560 versus output stage 570 provided by device 400, shown in FIG. 4. For instance, the smaller nanosheet fins in input stage 560 may be utilized to reduce capacitance that may be experienced by other devices around device 500 while the larger nanosheet fins in output stage 570 may be utilized to increase the drive current capacity of device 500 and provide as much drive output as possible to other devices outside of device 500.

Figure 6:
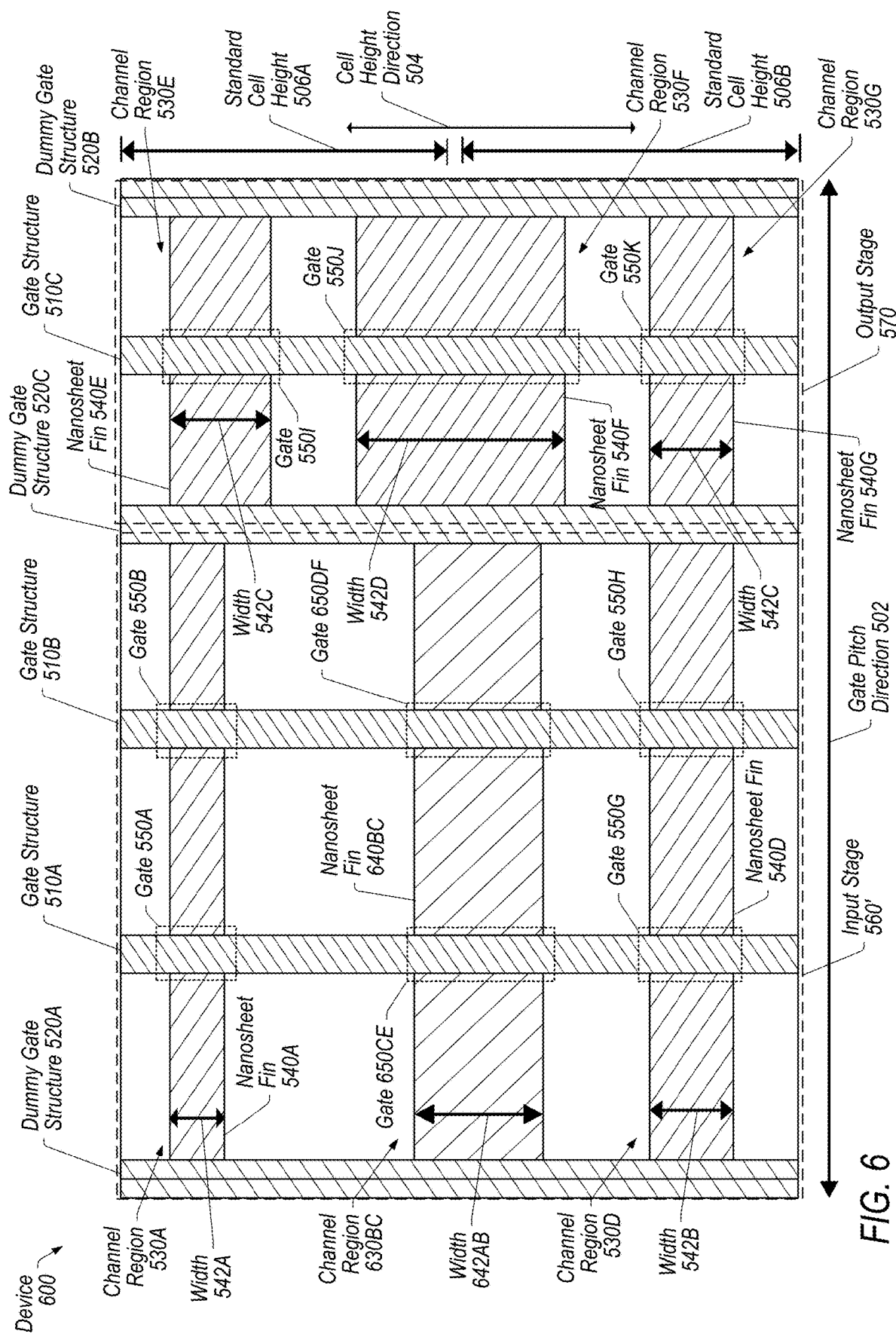
FIG. 6 depicts a top plan view representation of a layout of a transistor device with nanosheet transistors having merged nanosheet fins in both the input stage and the output stage, according to some embodiments.

FIG. 6 depicts a top plan view representation of a layout of a transistor device with nanosheet transistors having merged nanosheet fins in both the input stage and the output stage, according to some embodiments. In the illustrated embodiment, transistor device 600 is substantially similar to device 500, shown in FIG. 5, with the exception of changes to the input stage. For instance, input stage 560', shown in FIG. 6, is substantially similar to input stage 560, shown in FIG. 5, except that the channel regions (along with the nanosheet fins) in the vertical center portion of the input stage are merged.

In various embodiments, input stage 560' includes merged channel region 630BC with merged nanosheet fin 640BC.

Channel region 630BC may, for example, be formed by moving individual channel region 530B and individual channel region 530C, shown in FIG. 5, adjacent to each other (or with some overlap) at or near a boundary of standard cell height 506A and standard cell height 506B to merge the individual channel regions and form the single channel region that is channel region 630BC. Nanosheet fin 640BC is correspondingly formed with the merging of the channel regions as a merge between individual nanosheet fin 530B and individual nanosheet fin 530C.

With merged channel region 630BC and merged nanosheet fin 640BC formed in input stage 560', active gate 650CE (dotted line box) and active gate 650DF (dotted line box) may be formed as merged active gates in relation to active gates 550C-F, shown in FIG. 5. For example, active gate 650CE may be formed at the region where merged nanosheet fin 640BC (oriented in gate pitch direction 502) intersects active gate structure 510A (oriented in cell height direction 504) and merged active gate 650DF (dotted line box) may be formed at the region where merged nanosheet fin 640BC intersects active gate structure 510B (oriented in cell height direction 504).

In the illustrated embodiment, merged nanosheet fin 640BC has width 642AB. Width 642AB may be for instance a width that is the sum of width 542A and width 542B (shown in both FIGS. 5 and 6). Accordingly, the formation of merged nanosheet fin 640BC creates a third sizing of width for nanosheet fins in the input stage (input stage 560'). For instance, width 642AB is the third available width added to the first available width, width 542A, and the second available width, width 542B, which are different sized widths, as described above.

The different widths for nanosheet fins in input stage 560' provide active gates with different capabilities within the input stage. Additionally, merging of the channel regions and nanosheet fins reduces the total number of active gates in input stage 560' while maintaining the total area (e.g., current drive capacity) of the active gates in the input stage. For instance, input stage 560', shown in FIG. 6, has six active gates while input stage 560, shown in FIG. 5 has eight active gates but the total active gate area (and thus current drive capacity) is approximately the same. Having additional variation in the width of the nanosheet fins in input stage 560' provides additional flexibility in the design of device 600 by providing three options for gate properties and corresponding gate connectivity that may be implemented in various different types of transistor devices.

Example Computer System

Figure 7:
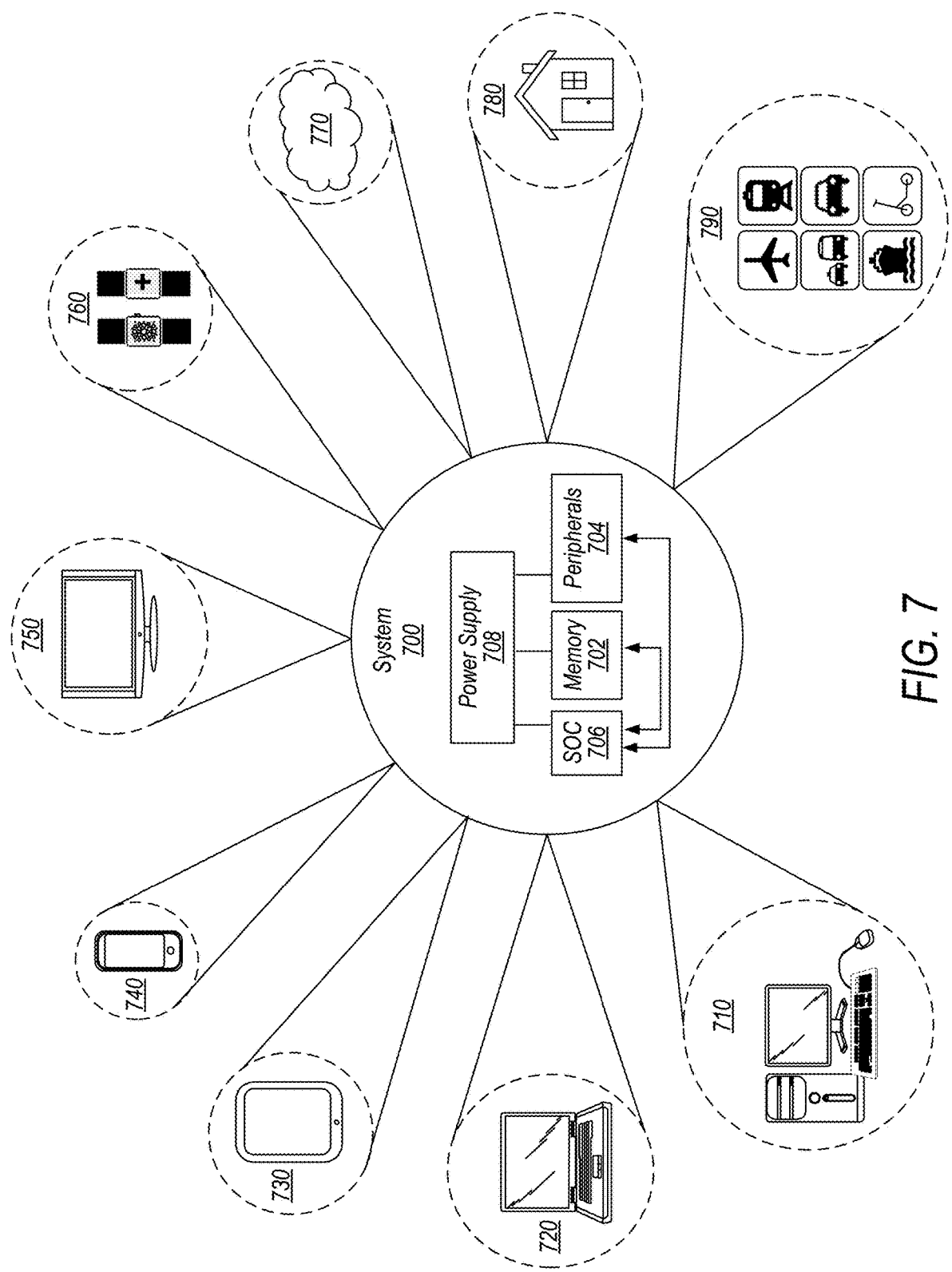
FIG. 7 is a block diagram of one embodiment of an example system.

Turning next to FIG. 7, a block diagram of one embodiment of a system 700 is shown that may incorporate and/or otherwise utilize the methods and mechanisms described herein. In the illustrated embodiment, the system 700 includes at least one instance of a system on chip (SoC) 706 which may include multiple types of processing units, such as a central processing unit (CPU), a graphics processing unit (GPU), or otherwise, a communication fabric, and interfaces to memories and input/output devices. In some embodiments, one or more processors in SoC 706 includes multiple execution lanes and an instruction issue queue. In various embodiments, SoC 706 is coupled to external memory 702, peripherals 704, and power supply 708.

A power supply 708 is also provided which supplies the supply voltages to SoC 706 as well as one or more supply voltages to the memory 702 and/or the peripherals 704. In various embodiments, power supply 708 represents a battery (e.g., a rechargeable battery in a smart phone, laptop or tablet computer, or other device). In some embodiments, more than one instance of SoC 706 is included (and more than one external memory 702 is included as well).

The memory 702 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

The peripherals 704 include any desired circuitry, depending on the type of system 700. For example, in one embodiment, peripherals 704 includes devices for various types of wireless communication, such as Wi-Fi, Bluetooth, cellular, global positioning system, etc. In some embodiments, the peripherals 704 also include additional storage, including RAM storage, solid state storage, or disk storage. The peripherals 704 include user interface devices such as a display screen, including touch display screens or multi-touch display screens, keyboard or other input devices, microphones, speakers, etc.

As illustrated, system 700 is shown to have application in a wide range of areas. For example, system 700 may be utilized as part of the chips, circuitry, components, etc., of a desktop computer 710, laptop computer 720, tablet computer 730, cellular or mobile phone 740, or television 750 (or set-top box coupled to a television). Also illustrated is a smartwatch and health monitoring device 760. In some embodiments, smartwatch may include a variety of general-purpose computing related functions. For example, smartwatch may provide access to email, cellphone service, a user calendar, and so on. In various embodiments, a health monitoring device may be a dedicated medical device or otherwise include dedicated health related functionality. For example, a health monitoring device may monitor a user's vital signs, track proximity of a user to other users for the purpose of epidemiological social distancing, contact tracing, provide communication to an emergency service in the event of a health crisis, and so on. In various embodiments, the above-mentioned smartwatch may or may not include some or any health monitoring related functions. Other wearable devices are contemplated as well, such as devices worn around the neck, devices that are implantable in the human body, glasses designed to provide an augmented and/or virtual reality experience, and so on.

System 700 may further be used as part of a cloud-based service(s) 770. For example, the previously mentioned devices, and/or other devices, may access computing resources in the cloud (i.e., remotely located hardware and/or software resources). Still further, system 700 may be utilized in one or more devices of a home 780 other than those previously mentioned. For example, appliances within the home may monitor and detect conditions that warrant attention. For example, various devices within the home (e.g., a refrigerator, a cooling system, etc.) may monitor the status of the device and provide an alert to the homeowner (or, for example, a repair facility) should a particular event be detected. Alternatively, a thermostat may monitor the temperature in the home and may automate adjustments to a heating/cooling system based on a history of responses to various conditions by the homeowner. Also illustrated in FIG. 7 is the application of system 700 to various modes of transportation 790. For example, system 700 may be used in the control and/or entertainment systems of aircraft, trains, buses, cars for hire, private automobiles, waterborne vessels from private boats to cruise liners, scooters (for rent or owned), and so on. In various cases, system 700 may be used to provide automated guidance (e.g., self-driving vehicles), general systems control, and otherwise. These any many other embodiments are possible and are contemplated. It is noted that the devices and applications illustrated in FIG. 7 are illustrative only and are not intended to be limiting. Other devices are possible and are contemplated.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation— [entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of task or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements defined by the functions or operations that they are configured to implement, The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g., passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

What is claimed is:

1. An integrated circuit device, comprising:
   a substrate;
   a plurality of gate structures oriented along a first direction in a horizontal dimension above the substrate;
   a plurality of elongated channel regions oriented along a second direction in the horizontal dimension, the second direction being perpendicular to the first direction, wherein the elongated channel regions pass through at least one of the gate structures, and wherein the elongated channel regions include two or more nanosheet fins stacked in a vertical dimension above the substrate;
   a first stage including at least two of the elongated channel regions, the nanosheet fins in a first of the at least two elongated channel regions of the first stage having a first width along the first direction in the horizontal dimension, the nanosheet fins in a second of the at least two elongated channel regions of the first stage having a second width along the first direction in the horizontal dimension, the second width being larger than the first width; and
   a second stage including at least one other of the elongated channel regions, the nanosheet fins in the at least one other elongated channel region of the second stage having a third width along the first direction in the horizontal dimension, the third width being larger than the first width.

2. The device of claim 1, wherein the nanosheet fins are aligned parallel to the substrate in the vertical dimension.

3. The device of claim 1, wherein an active gate is formed at an intersection of at least one of the elongated channel regions and at least one of the gate structures.

4. The device of claim 1, wherein the elongated channel regions extend between a first dummy gate structure on a first side of the device in the horizontal dimension and a second dummy gate structure on a second side of the device in the horizontal dimension.

5. The device of claim 1, wherein the nanosheet fins are substantially surrounded by a portion of the at least one gate structure where the nanosheet fins pass through the at least one gate structure.

6. The device of claim 1, wherein the first stage includes at least one additional elongated channel region with the nanosheet fin in the at least one additional elongated channel region of the first stage having the first width.

7. The device of claim 1, wherein the second stage includes at least two of the elongated channel regions, the nanosheet fins in the at least two elongated channel regions of the second stage having the third width.

8. The device of claim 1, wherein the second stage includes at least two of the elongated channel regions, the nanosheet fins in the at least two elongated channel regions of the second stage being merged.

9. The device of claim 1, wherein the device includes one or more integrated circuit cells, and wherein the first direction in the horizontal dimension is a cell height direction and the second direction in the horizontal dimension is a gate pitch direction.

10. The device of claim 9, wherein at least one of the gate structures extends across both the first stage and the second stage in the cell height direction.

11. The device of claim 9, wherein the second stage is separated from the first stage in the gate pitch direction by at least one dummy gate structure oriented in the cell height direction.

12. The device of claim 1, wherein the first stage includes at least one additional elongated channel region with the nanosheet fin in the at least one additional elongated channel region of the first stage having the second width.

13. The device of claim 1, wherein the third width is a same width as the second width.

14. An integrated circuit device, comprising:
    a plurality of gate structures oriented along a first direction in a horizontal dimension above a substrate, wherein the plurality of gate structures includes:
      a first dummy gate structure positioned on a first side of the device along a second direction in the horizontal dimension, the second direction being perpendicular to the first direction;
      a second dummy gate structure positioned on a second side of the device along the second direction; and
      at least one active gate structure positioned between the first dummy gate structure and the second dummy gate structure;
    a plurality of elongated channel regions oriented along the second direction and extending between the first dummy gate structure and the second dummy gate structure, wherein the elongated channel regions pass through the at least one active gate structure, and wherein the elongated channel regions include two or more nanosheet fins stacked in a vertical dimension above the substrate;
    a first stage including at least one of the elongated channel regions, the nanosheet fins in the at least one elongated channel region of the first stage having a first width along the first direction in the horizontal dimension; and a second stage including at least two other of the elongated channel regions, the nanosheet fins in at least one of the two other elongated channel regions of the second stage having a second width along the first direction in the horizontal dimension, the second width being larger than the first width, and wherein the nanosheet fins in the at least two other elongated channel regions of the second stage are merged.

15. The device of claim 14, wherein the second stage is separated from the first stage in the first direction.

16. The device of claim 14, wherein the gate structures extend across both the first stage and the second stage.

17. The device of claim 14, wherein the first stage includes at least two of the elongated channel regions, the nanosheet fins in the at least two elongated channel regions of the first stage having the first width, and wherein the second stage includes at least two of the elongated channel regions, the nanosheet fins in the at least two elongated channel regions of the second stage having the second width.

18. An integrated circuit device, comprising:
a plurality of gate structures oriented along a first direction in a horizontal dimension above a substrate, wherein the plurality of gate structures includes:
a first dummy gate structure positioned on a first side of the device along a second direction in the horizontal dimension, the second direction being perpendicular to the first direction;
a second dummy gate structure positioned on a second side of the device along the second direction;
two or more active gate structures positioned between the first dummy gate and the second dummy gate; and
a third dummy gate structure positioned between at least two of the active gate structures;
a first stage including:
a plurality of first elongated channel regions oriented along the second direction and extending between the first dummy gate structure and the third dummy gate structure, wherein the first elongated channel regions pass through at least one of the active gate structures, wherein the first elongated channel regions include two or more first nanosheet fins stacked in a vertical dimension above the substrate, the first nanosheet fins in at least one of the first elongated channel regions of the first stage having a first width along the first direction in the horizontal dimension; and
a second stage including:
a plurality of second elongated channel regions oriented along the second direction and extending between the third dummy gate structure and the second dummy gate structure, wherein the second elongated channel regions pass through at least one other of the active gate structures, wherein the second elongated channel regions include two or more second nanosheet fins stacked in the vertical dimension above the substrate, the second nanosheet fins in at least one of the second elongated channel regions of the second stage having a second width along the first direction in the horizontal dimension, the second width being larger than the first width, and wherein the second nanosheet fins in at least two of the second elongated channel regions are merged.

19. The device of claim 18, wherein the second stage is separated from the first stage by the third dummy gate structure.

20. The device of claim 18, wherein the first stage further includes at least one first nanosheet fin in at least one other of the first elongated channel regions of the first stage having the second width.

* * * * *